(12) United States Patent
Neumüller et al.

(10) Patent No.: US 9,024,192 B2
(45) Date of Patent: May 5, 2015

(54) MULTIFILAMENT CONDUCTOR AND METHOD FOR PRODUCING SAME

(75) Inventors: Heinz-Werner Neumüller, Uttenreuth (DE); Günter Ries, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 343 days.

(21) Appl. No.: 13/392,380

(22) PCT Filed: Aug. 24, 2010

(86) PCT No.: PCT/EP2010/062285
§ 371 (c)(1),
(2), (4) Date: Feb. 24, 2012

(87) PCT Pub. No.: WO2011/023670
PCT Pub. Date: Mar. 3, 2011

(65) Prior Publication Data
US 2012/0181062 A1   Jul. 19, 2012

(30) Foreign Application Priority Data
Aug. 26, 2009   (DE) .......................... 10 2009 038 920

(51) Int. Cl.
*H01B 7/00* (2006.01)
*H01L 39/14* (2006.01)
*H01L 39/24* (2006.01)

(52) U.S. Cl.
CPC .......... *H01L 39/143* (2013.01); *H01L 39/2464* (2013.01); *H01L 39/248* (2013.01)

(58) Field of Classification Search
USPC ......... 174/125.1, 126.1, 126.2; 505/231, 230, 505/234, 232; 428/930; 427/62
See application file for complete search history.

(56) References Cited

U.S. PATENT DOCUMENTS 749,639 A    1/1904   Sternberg
3,513,251 A * 5/1970  Schoerner ................. 174/110 R
(Continued)

FOREIGN PATENT DOCUMENTS

CN          1813317 A      8/2006
CN          101164175      4/2008
(Continued)

OTHER PUBLICATIONS

Office Action mailed Jan. 14, 2014 in corresponding Canadian Application No. 2,772,158.
(Continued)

*Primary Examiner* — William H Mayo, III
(74) *Attorney, Agent, or Firm* — Staas & Halsey LLP

(57) ABSTRACT

A ribbon-shaped substrate and at least one superconductive layer form a multifilament conductor in which the superconductive layer is divided into filaments. The ribbon-shaped substrate has a first direction parallel to the longitudinal direction thereof, and the at least one filament has a second direction parallel to the longitudinal direction thereof. The first and second directions form an angle not equal to zero. The filaments of the multifilament conductor can be configured on the front and back of the conductor and be electrically connected to each other such that a transposed conductor is created.

15 Claims, 6 Drawing Sheets

(56) References Cited

U.S. PATENT DOCUMENTS

| | | | | |
|---|---|---|---|---|
| 5,366,953 | A | * | 11/1994 | Char et al. ............... 505/329 |
| 5,591,696 | A | * | 1/1997 | McDevitt et al. ........... 505/234 |
| 6,074,768 | A | * | 6/2000 | Matsunaga et al. .......... 428/700 |
| 6,730,410 | B1 | * | 5/2004 | Fritzemeier et al. ......... 428/469 |
| 6,765,151 | B2 | * | 7/2004 | Fritzemeier et al. ....... 174/125.1 |
| 6,828,507 | B1 | * | 12/2004 | Fritzemeier et al. ....... 174/125.1 |
| 6,893,732 | B1 | | 5/2005 | Fritzemeier et al. |
| 7,365,271 | B2 | | 4/2008 | Knoll et al. |
| 7,463,915 | B2 | | 12/2008 | Thieme et al. |
| 7,756,557 | B1 | * | 7/2010 | Barnes et al. .............. 505/231 |
| 7,781,376 | B2 | * | 8/2010 | Kodenkandath et al. ..... 505/235 |
| 2002/0031686 | A1 | * | 3/2002 | Jia et al. ................. 428/697 |
| 2004/0206952 | A1 | * | 10/2004 | Jia et al. ................. 257/32 |
| 2004/0266628 | A1 | | 12/2004 | Lee et al. |
| 2005/0139380 | A1 | | 6/2005 | Knoll et al. |
| 2005/0205014 | A1 | * | 9/2005 | Groves et al. ............. 118/723 FI |
| 2006/0040829 | A1 | | 2/2006 | Rupich et al. |
| 2006/0040830 | A1 | | 2/2006 | Thieme et al. |
| 2006/0073975 | A1 | * | 4/2006 | Thieme et al. .............. 505/125 |
| 2007/0015666 | A1 | | 1/2007 | Hans |
| 2007/0111893 | A1 | * | 5/2007 | Kodenkandath et al. ..... 505/210 |
| 2007/0191202 | A1 | | 8/2007 | Foltyn et al. |
| 2007/0197395 | A1 | * | 8/2007 | Kodenkandath et al. ..... 505/210 |
| 2007/0232500 | A1 | * | 10/2007 | Selvamanickam et al. ... 505/232 |
| 2011/0319271 | A1 | | 12/2011 | Selvamanickam et al. |

FOREIGN PATENT DOCUMENTS

| | | | |
|---|---|---|---|
| JP | 9-120719 | | 5/1997 |
| JP | 2005-85612 | | 3/2005 |
| JP | 2007-87734 | | 4/2007 |
| JP | 2007-305386 | | 11/2007 |
| WO | 01/08169 | A2 | 2/2001 |
| WO | 01/08169 | A3 | 2/2001 |
| WO | WO 01/08169 A2 * | | 2/2001 ............. H01B 12/00 |
| WO | 2005/055275 | A2 | 6/2005 |

OTHER PUBLICATIONS

English Translation of Japanese Office Action mailed Jan. 14, 2014 in corresponding Japanese Application No. 2012-526028.
International Search Report for PCT/EP2010/062285; mailed Dec. 14, 2010.
P. Barnes, et al; "Low AC Loss Structure in YBCO Coated Conductors with Filamentary Current Sharing"; IEEE Transactions on Applied Superconductivity, vol. 15, No. 2, Jun. 2005, pp. 2827-2830.
German Office Action for 102009038920.2-34; dated Jul. 30, 2010.
Chinese Office Action mailed Feb. 7, 2014 in corresponding Chinese Application No. 201080037916.4.
Russian Office Action mailed Jul. 7, 2014 in corresponding Russian Patent Application No. 2012111340/28.
Office Action dated Nov. 14, 2014 in corresponding Russian Patent Application No. 2012111340/28.
German Translation of Chinese Office Action dated Sep. 25, 2014 in corresponding Chinese Patent Application No. 201080037916.4.

* cited by examiner

MULTIFILAMENT CONDUCTOR AND METHOD FOR PRODUCING SAME

CROSS REFERENCE TO RELATED APPLICATIONS

This application is the U.S. national stage of International Application No. PCT/EP2010/062285, filed Aug. 24, 2010 and claims the benefit thereof. The International Application claims the benefits of German Application No. 102009038920.2 filed on Aug. 26, 2009, both applications are incorporated by reference herein in their entirety.

BACKGROUND

Described below is a multifilament conductor with a ribbon-shaped substrate and at least one superconducting layer. The at least one superconducting layer is formed on at least one surface of the ribbon-shaped substrate and is subdivided into filaments. The ribbon-shaped substrate has a first direction parallel to its longitudinal extent and the at least one filament has a second direction parallel to its longitudinal extent. Also described below is a method for producing such a multifilament conductor.

Multifilament conductors having superconducting layers are used, inter alia, as conductors in superconducting devices. They may be used for example in superconducting windings of magnetic resonance tomographs, in motors, in generators or in current limiters. Particularly when using high-temperature superconducting (HTS) materials, for example $Y_2BaCu_3O_7$ (YBCO), superconducting properties of the conductors are already achieved at liquid nitrogen temperatures. Reliable and economical superconducting devices can be produced in this way.

Second-generation (2G) industrial HTS conductors have a monocrystalline HTS thin film, in particular made of ceramic YBCO, as the current-carrying layer, which is formed on a ribbon-shaped metallic carrier. In order to apply the monocrystalline HTS thin film onto the carrier, the latter is coated with a textured multicoat buffer layer onto which the HTS layer is applied by deposition methods, for example evaporation coating, laser deposition or chemical decomposition.

On the HTS layer, a normally conducting protection or stabilization layer is additionally applied, which can electrically bridge defects and short sections in the HTS layer which have become normally conductive, and which protects the HTS layer from mechanical damage. The normally conducting layer generally is formed of silver and/or copper. The ribbon-shaped carrier, on which the layer stack of buffer, HTS and stabilization layers is applied, generally has a width in the millimeter or centimeter range.

In AC applications, a time-variant field component perpendicular to the ribbon-shaped carrier is often encountered. In the HTS layer, and to a lesser extent in the stabilization layer as well, circulating shielding currents are thereby induced which are superimposed on a transport current. These shielding currents lead to electrical losses, which are released in the form of heat and have to be dissipated from the HTS conductors by a cooling device. Economical advantages by saving energy which are achieved using HTS conductors, in comparison with known ohmic conductors, are thereby reduced or entirely negated.

Losses per length $P_h/L$ are proportional to the alternating field amplitude $\Delta B$, frequency f, critical current $I_C$ and effective conductor width $d_f$ perpendicular to the magnetic field:

$$P_h/L = f \times \Delta B \times I_C \times d_f$$

In NbTi and $Nb_3Sn$ superconductors, the losses are reduced by dividing the cross section into a plurality of thin filaments with a small $d_f$, which are embedded in a metal matrix, for example of copper. This measure, however, is only effective when the conductor is twisted or stranded.

An application of this principle to HTS conductors is provided by Roebel conductors. WO 03/100875 A2 discloses such a Roebel conductor, which is constructed from a plurality of parallel HTS-coated ribbon-shaped carriers. Losses in a corresponding structure of an HTS conductor are determined by the width of the individual ribbon. In order to further minimize losses, it is known for example from US 2007/0191202 A1 to subdivide the superconducting layer and the copper stabilization layer into filaments by longitudinal grooves parallel to the longitudinal direction of the ribbon-shaped carrier. Methods for forming the longitudinal grooves or trenches, extending as far as the carrier, include mechanical treatment, chemical etching, laser processing, photoresist techniques and local disruption of crystalline ordering. A filament on a carrier is thereby subdivided into a plurality of individual filaments, which extend parallel to the longitudinal axis of the carrier. The width of the individual filaments on the carrier is taken as the effective conductor width $d_f$, rather than the width of the superconducting coated carrier as a filament.

Although a reduction of the losses can be found in short conductor samples, in long conductor portions, for example in coil windings, the magnetic coupling between filaments is not however eliminated and an external alternating field, as occurs for example in coils, still induces large shielding currents. The shielding currents may exceed the critical current density of the superconducting material, so that the superconductor enters the resistive state. Significant electrical losses are incurred, which must in turn be dissipated in the form of heat.

SUMMARY

It is therefore an aspect to provide a multifilament conductor which presents a further reduction of the electrical losses in comparison with multifilament conductors known from the prior art. In particular, it is an aspect of the multifilament conductor to minimize the induction of currents in the multifilament conductor in external alternating fields. It is a further aspect to provide a method for producing a multifilament conductor, which presents minimal electrical losses with minimized induction of currents in the multifilament conductor in external alternating fields.

The multifilament conductor described below has a ribbon-shaped substrate and at least one superconducting layer. The at least one superconducting layer is formed on at least one surface of the ribbon-shaped substrate and is subdivided into filaments. The ribbon-shaped substrate has a first direction parallel to its longitudinal extent and the at least one filament has a second direction parallel to its longitudinal extent. The first direction of the ribbon-shaped substrate makes an angle which is greater than zero with the second direction of the at least one filament.

In this way, it is possible to effectively reduce the losses in alternating-field applications and the influences of local faults in industrial superconducting conductors, when using the multifilament conductors for example in coils in which the conductors are wound over one another. Particularly in bifilar-wound coils, a significant reduction of the losses is achieved. The losses $P_h$ due to an alternating-field amplitude $\Delta B$ perpendicular to the multifilament conductor depend not on the conductor width but on the width of the individual filaments. The level of hysteresis losses is reduced by the factor $d_f/b$. In magnetic applications, for example in nuclear spin tomography, in nuclear magnetic resonance spectrometers and in accelerators, in which a high field accuracy is required, the field defects produced in the working volume by the smaller shielding currents, which are localized to the filament width, are significantly reduced.

An angle of between 30 and 60 degrees, in particular 45 degrees, between the first direction of the ribbon-shaped substrate and the second direction of the at least one filament is particularly advantageous. The at least one filament may be formed fully along the second direction, in particular without a length component parallel to the first direction. Length components along the first direction increase the losses in applications such as, for example, bifilar-wound coils.

The ribbon-shaped substrate may have a first surface on a front side and an opposite second surface on a rear side, a plurality of filaments being formed on both the first and second surfaces. The filaments of the first surface may have a second direction which is not equal to a third direction parallel to the longitudinal direction of the filaments of the second surface. A loss reduction effect similar to the reduction in bifilar-wound coils is thereby achieved in the conductor.

Low-loss current conduction is in this case obtained particularly with a transposed version of the conductor. To this end, the at least one filament of the front side may be electrically conductively connected to the at least one filament of the rear side, in particular by at least one layer which is formed on at least one third surface on one or two side faces of the ribbon-shaped substrate. A transposition length may lie in the region of 20 cm.

Bridging of defects in the superconducting layer may be carried out particularly effectively, and losses thereby reduced further, if at least one electrical bridge is formed between at least two neighboring filaments on one surface. An electrical connection or electrical connections of the at least two neighboring filaments are formed by the bridge or bridges. The at least one electrical bridge may be arranged centrally on the one surface, in particular with a longitudinal direction of the bridge parallel to the one first direction of the ribbon-shaped substrate. A defective filament with reduced local current-carrying capacity is electrically bridged by the bridge and the neighboring filament.

The multifilament conductor may include a layer stack of ribbon-shaped carrier material, at least one buffer layer, at least one superconducting layer, in particular a high-temperature superconducting (HTS) layer, and/or at least one stabilization layer. The buffer layer makes an epitaxially grown monocrystalline superconducting layer on the carrier material possible. An HTS layer makes it possible to use the multifilament conductor with superconducting properties even at temperatures in the region of liquid nitrogen. The stabilization layer protects the superconducting layer from mechanical damage and electrically bridges local positions in the superconducting layer with reduced current-carrying capacity, i.e. it stabilizes and protects mechanically and electrically.

The carrier material may be a metal, in particular steel. The at least one buffer layer may include at least one material from the group: Al, yttria, IBAD MgO, homo-epi MgO, LMO, or combinations and/or alloys or layer stacks of these materials. The at least one superconducting layer may be YBCO. The at least one bridge may likewise be YBCO, in particular the YBCO of the at least one HTS layer. This allows loss-free electrical conduction even via the bridge. The at least one stabilization layer may be copper or silver or include a layer stack with at least one copper and/or at least one silver layer.

The at least one bridge may also include the material of the at least one stabilization layer, which allows straightforward production of the bridge.

The carrier material may have a thickness in the range of from 50 to 100 µm and a width in the region of 10 mm. The at least one buffer layer may have a thickness in the region of 100 nm. The at least one superconducting layer may have a thickness in the region of 1 µm, and the at least one filament may have a width in the region of 0.5 mm. The at least one stabilization layer may have a thickness in the range of from 3 µm to 300 µm. These are favorable dimensions for a multiplicity of applications of a multifilament conductor.

A method for producing the multifilament conductor described above includes:
- two ribbon-shaped carrier materials are brought into mechanical connection with one another via opposite sides and
- at least one superconducting layer is respectively applied on a side of a ribbon-shaped carrier material which lies opposite the side of the mechanical connection, and
- a stabilization layer is applied onto the superconducting layer,
- the stabilization layer of a first ribbon-shaped carrier material being formed overlapping with the stabilization layer of a second ribbon-shaped carrier material at the edges of the two ribbon-shaped carrier materials so that an electrical connection of the stabilization layers is established via the edges, and
- the superconducting layers and the stabilization layers being subdivided into filaments.

The two ribbon-shaped carrier materials may be brought congruently into connection with one another. This method allows straightforward and economical production of the multifilament conductor in few steps.

The application of layers may be carried out by electrolysis, soldering, evaporation coating, sputtering and/or thermal decomposition of metal compounds in the vapor phase. The subdivision of the superconducting layers and the subdivision of the stabilization layers into filaments may be carried out mechanically or by lasering and/or etching, in particular dry or wet chemical etching, of trenches respectively passing fully through a layer. Photolithography may in particular be used in the etching method. Alternatively, the application of layers may be carried out by printing or adhesively bonding the as yet uncoated substrate ribbon at the position of the trenches. During the subsequent deposition of superconductor and stabilization layers, no material application takes place here so that the desired filament structure is formed.

Trenches may be formed with a non-zero angle between the first direction of the ribbon-shaped substrate and the second direction of the at least one filament. The filaments on the two ribbon-shaped carrier materials may be electrically connected via their edges so as to form spiral-shaped current paths.

The two ribbon-shaped carrier materials of the double-layered substrate may be separated from one another by a heat-resistant insulating interlayer or an air gap. This may, in particular, be carried out by welding two ribbon-shaped carrier materials, by folding a ribbon-shaped carrier ribbon into two ribbons lying above one another, or by rolling a tube flat, in particular before a texturizing rolling of the ribbon-shaped carrier materials.

For the method for producing the multifilament conductor, the aforementioned advantages associated with the multifilament conductor are achieved.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
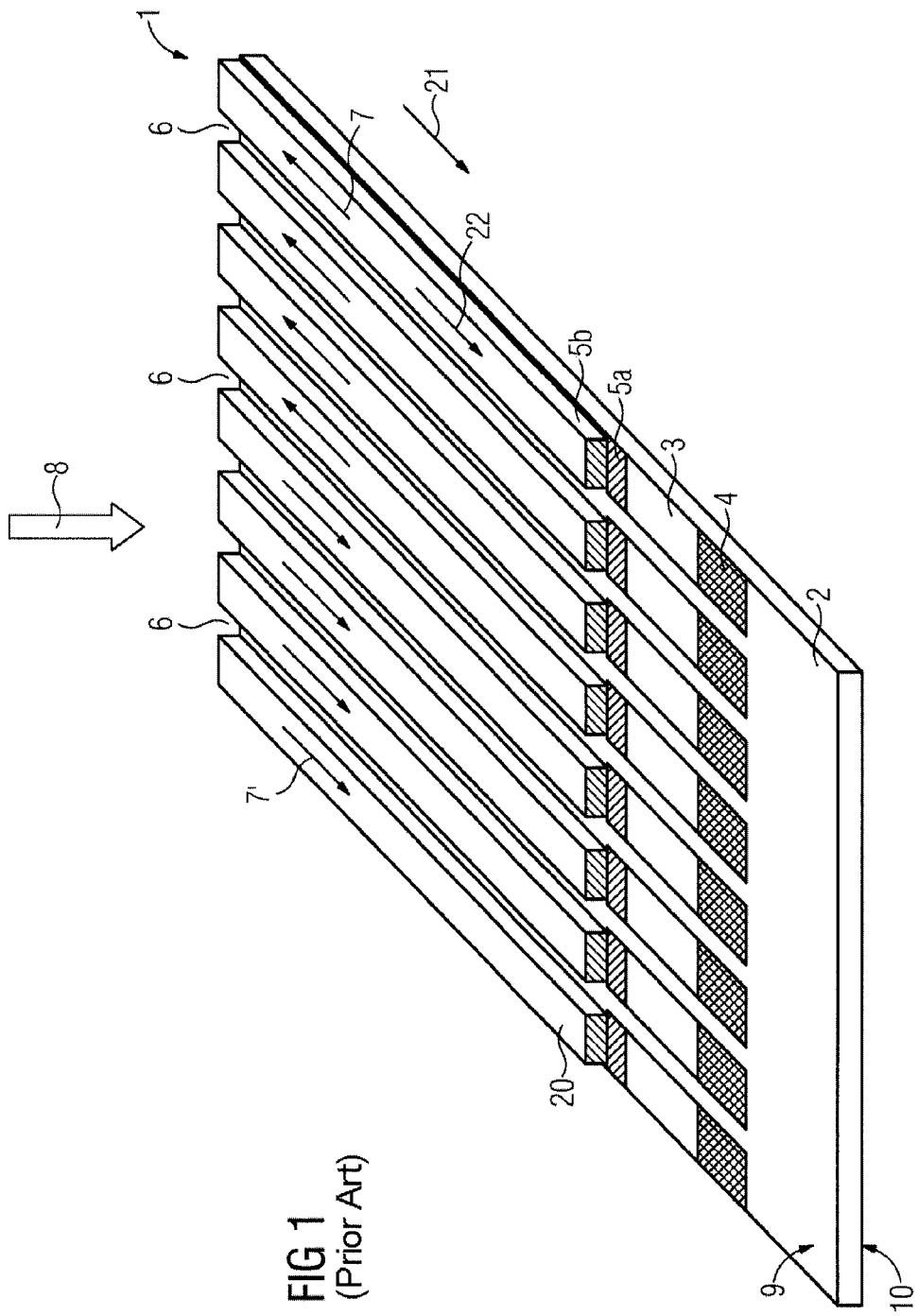
FIG. 1 is a perspective view of a multifilament conductor with filaments parallel to the substrate axis, according to the prior art.

Reference will now be made in detail to the preferred embodiments, examples of which are illustrated in the accompanying drawings, wherein like reference numerals refer to like elements throughout.

FIG. 1 shows a section perpendicular to the longitudinal axis of a multifilament conductor 1, in oblique view from the front onto the multifilament conductor 1, according to the prior art. The multifilament conductor 1 includes a ribbon-shaped substrate 2 having a front side 9 and a rear side 10. A first direction 21 of the ribbon-shaped substrate 2 is defined as the longitudinal direction of the ribbon-shaped substrate 2. Parallel to the first direction 21, strip-shaped, mutually parallel strips of a buffer layer 4 are applied on the front side 21 of the ribbon-shaped substrate 2. The strips of the buffer layer 4 are separated from one another, and have a second direction 22 which corresponds to the longitudinal direction of the strips of the buffer layer 4. A superconducting layer 3, for example of YBCO material, is formed on the strips of the buffer layer 4. A thin silver layer (Ag layer) 5a and a copper layer (Cu layer) 5b is formed as a support or stabilization layer 5 on the superconducting layer 3. Between the layer stacks or filaments 20, respectively the buffer layer 4, the superconducting layer 3 and the stabilization layer 5, through-trenches 6 are formed for separating the filaments 20.

Under the action of a time-variant external magnetic field (B) 8 on the multifilament conductor 1, currents I are induced in the stabilization layer 5 and/or the superconducting layer 3. These induced currents I flow in one half of the number of filaments 20 with one current direction 7 and in the other half of the number of filaments 20 with an oppositely directed current direction 7'. The current paths are closed at the conductor ends. The currents I generally exceed the critical current of the filaments 20 and drive the superconductor into the resistive state, so that considerable ohmic losses occur. In an untwisted conductor according to FIG. 1, these increase linearly with the total ribbon width b, and the subdivision of the filaments 20 of width $d_f$ exerts no effect.

Figure 2:
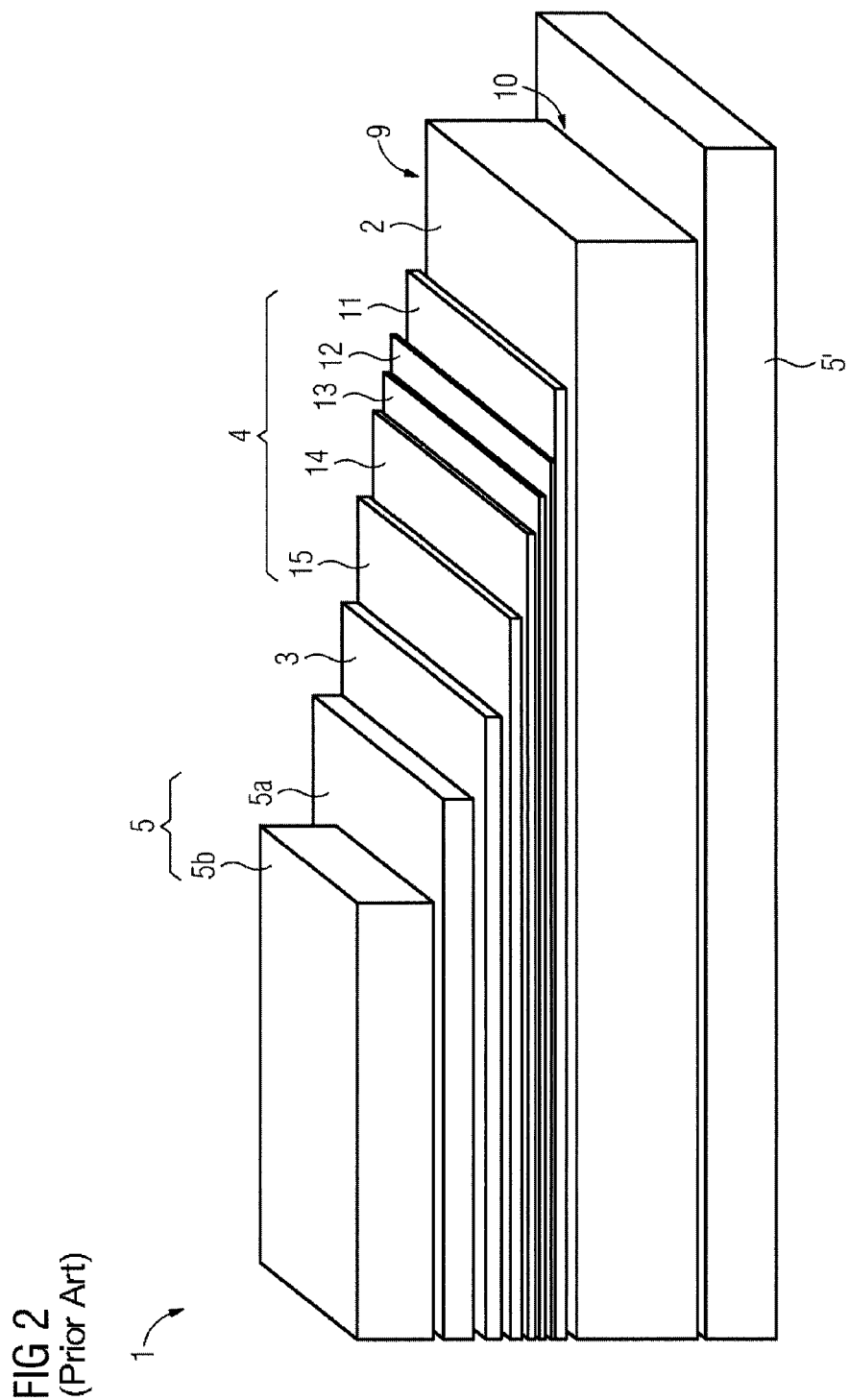
FIG. 2 is a perspective view of the layer structure of a filament of a multifilament conductor according to the prior art.

FIG. 2 represents the layer structure of a filament 20 according to the prior art in detail. A thin aluminum (Al) layer 11 is applied as strips on the front side 9 of the substrate 2, an oblique view of a sectional representation along the strip being shown in FIG. 2. On the Al layer 11 is a layer of yttria 12. A layer of IBAD magnesium oxide (MgO) 13 and an epitaxial homo-epi MgO layer 14 are deposited thereon. An epitaxial LMO layer 15 is formed on the epitaxial homo-epi MgO layer 14. These layers 11 to 15 together form the buffer layer 4 and have an electrically insulating effect in relation to the substrate 2. They are used as a monocrystalline-ordered sublayer and lead to monocrystalline growth of the superconducting layer 3, for example of YBCO, on the substrate 2 over the buffer layer 3.

A silver (Ag) layer 5a and a copper (Cu) layer 5b are formed on the superconducting layer 3. These two layers form the stabilization layer 5, which protects the superconducting layer 3 from mechanical damage and electrically bridges defects in the monocrystalline superconducting material.

A further Cu layer may be formed as a second stabilization layer 5' on the rear side 10 of the substrate 2.

The substrate 2 of the multifilament conductor 1 in FIGS. 1 and 2 may be Hastelloy or steel, is 50 μm thick and has a width of 10 mm. The filament 20 represented in FIG. 2 includes a buffer layer 3 having a thickness of 100 nm, and has a width of 0.5 mm. The superconducting layer 3 is 1 μm thick and the stabilization layer 5 on the front side 9 of the substrate 2 is formed 23 μm thick, with a 20 μm thick Cu layer. The copper stabilization layer 5' on the rear side 10 of the substrate 2 is 20 μm thick.

Figure 3:
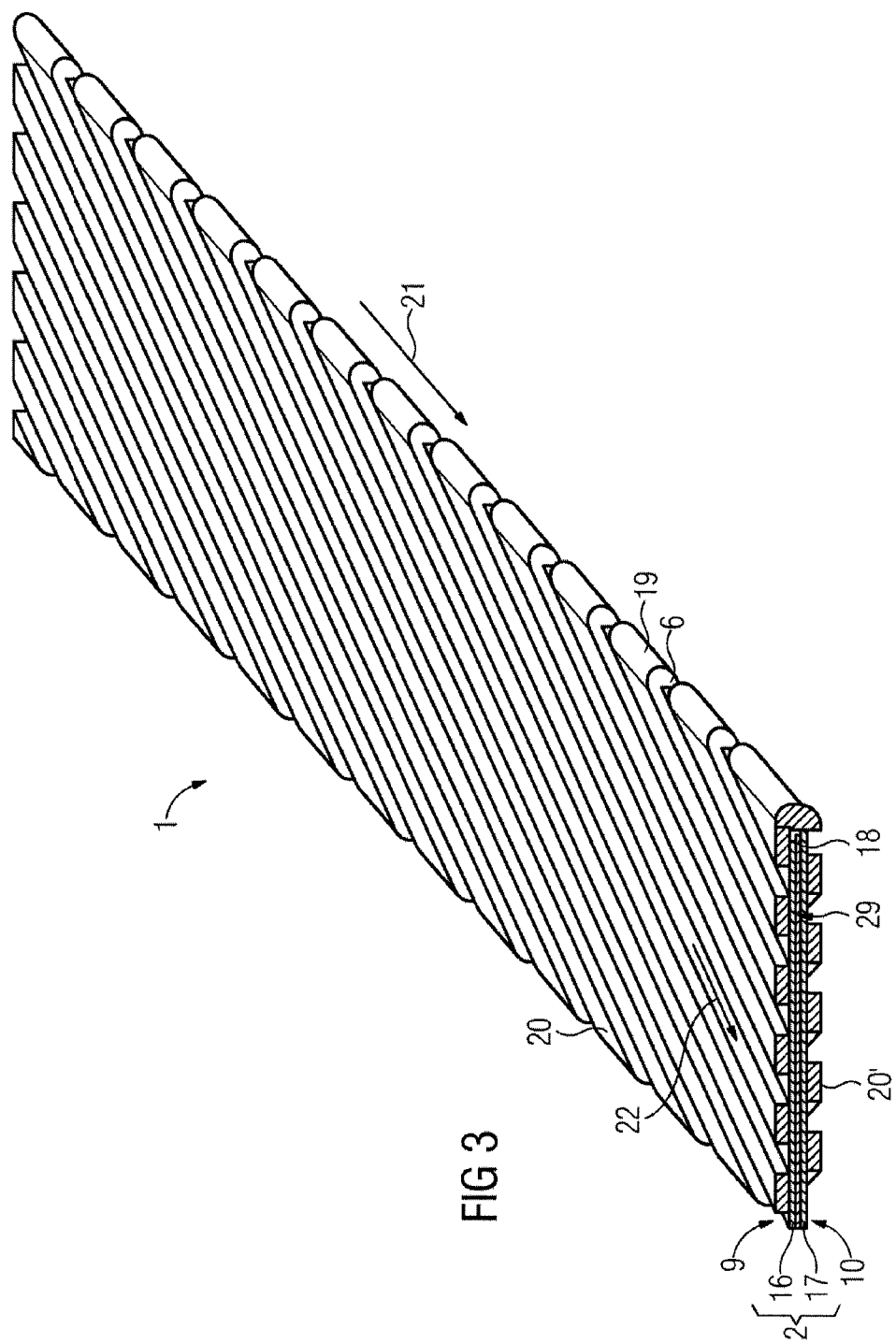
FIG. 3 is a perspective view of a multifilament conductor with filaments which, obliquely on a front and rear side of a substrate, are formed extending spirally around its circumference.

FIG. 3 represents a multifilament conductor 1 in oblique view from above. The substrate 2 of the multifilament conductor 1 may be Hastelloy or steel, is 50 μm thick and has a width of 10 mm. The filaments 20, 20' in this exemplary embodiment are arranged on the substrate 2 with a second direction 22, which constitutes the longitudinal direction of the filaments 20, which makes a non-zero angle with the first, the longitudinal direction 21 of the substrate 2. The superconducting filaments 20, 20' are respectively arranged on a surface of a first carrier 16 and second carrier 17. The two carriers 16 and 17 are both in mechanical connection with one another via their rear sides, which lie opposite the surfaces of filaments 20, 20', but electrically are essentially separated by an interlayer 29, the touching rear sides being referred to below as the side of mechanical connection 18. The two carriers 16 and 17 and the interlayer 29 together form the ribbon-shaped substrate 2 of the multifilament conductor 1.

On a surface of the substrate 2, trenches 6 are respectively formed passing fully through between the filaments 20, 20' so that the superconducting layers 3 of two neighboring filaments 20, 20' are respectively electrically separated from one another. The filaments 20 on the first carrier 16 are respectively arranged so that they lie congruently above one another at the edge 19 of the carrier 16 with the filaments 20' of the second carrier 17 at the edge 19 of the carrier 16, 17. During the deposition or formation of the stabilization layer 5 on the carriers 16 and 17, the material of the stabilization layer 5 is co-deposited at the edge 19. In this way, the filaments 20 of the carrier 16 are electrically connected to the filaments 20' of the carrier 17 via this material. During the formation of the trenches 6, these are likewise formed passing fully through the material of the stabilization layer 5 at the edge 19, so that filaments 20 and 20' lying above one another are electrically connected to one another only at the edge 19.

The layer thicknesses and substrate widths 2 and filament widths 20, 20' are the same as the thicknesses and widths described above for the multifilament conductor 1 of FIGS. 1 and 2.

The angle of the filaments 20 on the front side 9 has the opposite value to the angle of the filaments 20' on the rear side 10. The value of the angle lies in the range of from 1 to 5 degrees and from −1 to −5 degrees, respectively. Superconducting filaments 20, 20' with a limited length b, which end at the edges 19 of the ribbon-shaped substrate 2, are formed on the front and rear sides 9, 10. A stabilization layer 5, 5' of normally conducting material, for example copper, which is in electrical connection with the superconducting layer 3 of the filaments 20, 20' and can bridge the current at a defective, normally conducting position of the superconductor, is applied onto the superconducting filaments 20, 20'. At the edges 19 of the ribbon-shaped substrate 2, the stabilization layer 5, 5' is formed so that the filaments 20, 20' of the front and rear sides 9, 10 are electrically connected via a normally conducting layer.

In this way, one or more parallel spiral-shaped current paths, which are superconductive except for short normally conducting regions at the edges 19 of the ribbon-shaped substrate 2, are formed around the ribbon-shaped substrate 2. Therefore, a thin-film superconductor is produced having a "twist" known from known superconducting technology in the form of parallel twisted superconductor filaments, which present low losses in alternating-field applications.

Figure 4:
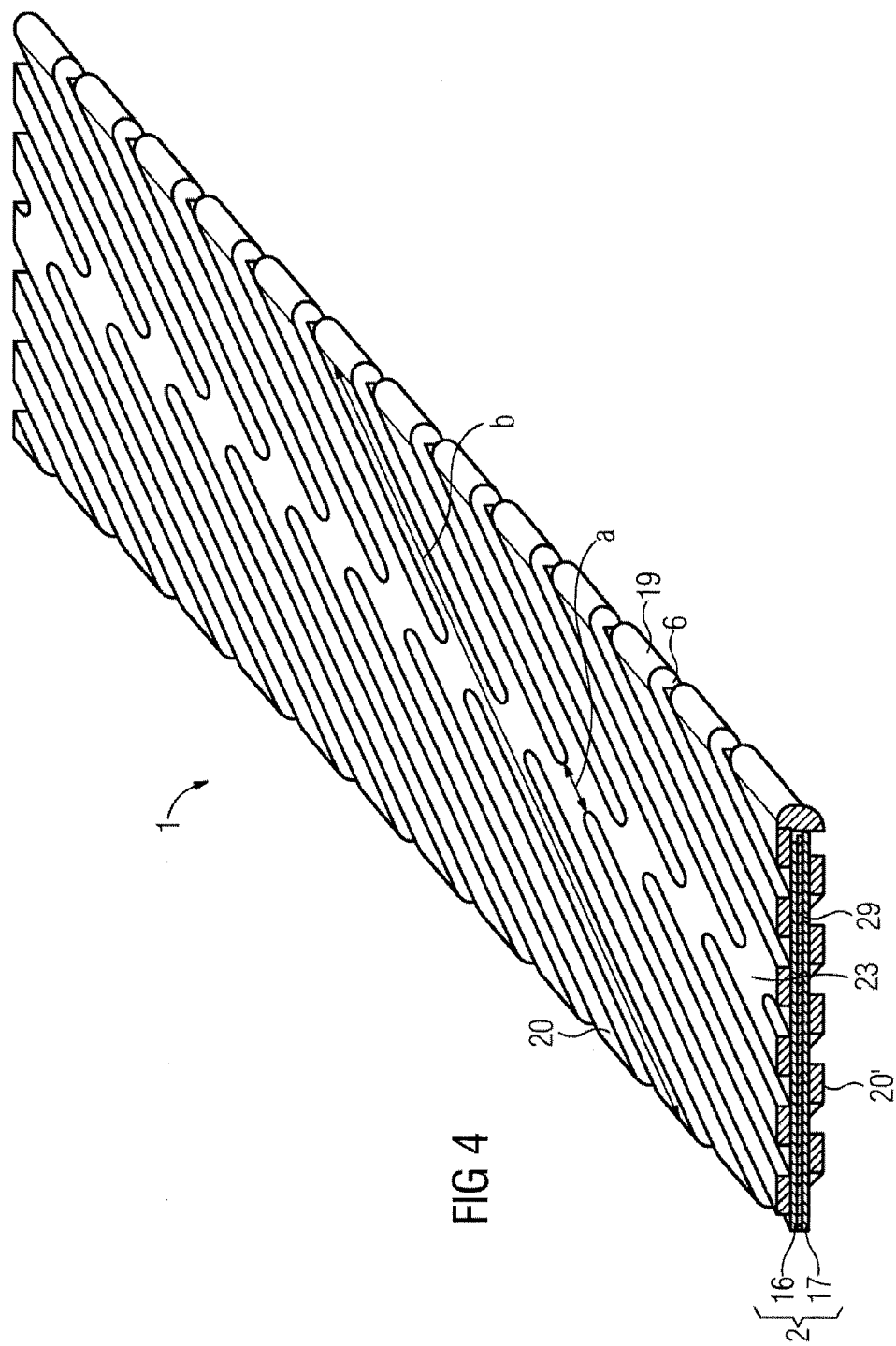
FIG. 4 is a perspective view of a multifilament conductor similar to the one shown in FIG. 3, bridges being formed between neighboring filaments.

FIG. 4 represents an alternative exemplary embodiment of the multifilament conductor 1. This multifilament conductor 1 is similar to the multifilament conductor 1 represented in FIG. 3, except for the additional formation of bridges 23 between neighboring filaments 20, 20'. In terms of layer structure, the bridges 23 are constructed similarly as in the filaments 20, 20' of FIGS. 1 to 3, or be formed of only the stabilization layer 5 or the stabilization layer 5 and the superconducting layer 3. They are formed electrically conductively and can bridge defects in the superconducting layer 3 of a filament 20, 20' via the superconducting layer 3 of the neighboring filament 20, 20'. In FIG. 4, the bridges 23 are arranged as a web centrally on the surface of the substrate 2 along its first direction 21. As an alternative, however, the bridges 23 may also be arranged at or close to the edge 19. They may also be arranged not as a continuous web, but alternating or irregularly on the surface between two respectively neighboring filaments 20, 20'. In the exemplary embodiment which is represented in FIG. 4, the width a of the bridges 23 is in the region of 1/20 of the length b of a filament 20 or 20' on one side of the substrate 2. Depending on the material and required current-carrying capacity, the width of the bridges 23 may also have different values.

In multifilament conductors 1, the likelihood that a local weak point in a filament 20 or 20' will reduce the current-carrying capacity rises with increasing length and decreasing width. In windings having a long length of the multifilament conductor 1, the current-carrying capacity of the entire multifilament conductor 1 with mutually insulated filaments 20 and 20' can thus be greatly compromised. By arranging bridges 23 between filaments 20 and 20', redistribution of the current from a damaged filament 20 or 20' into neighboring filaments 20 or 20' can take place. So long as the average distance between weak points along the filaments 20 or 20' is significantly greater than the transposition length L, the total current will find enough intact current paths and the critical total current is reduced only slightly even in long multifilament conductors 1.

Figure 5:
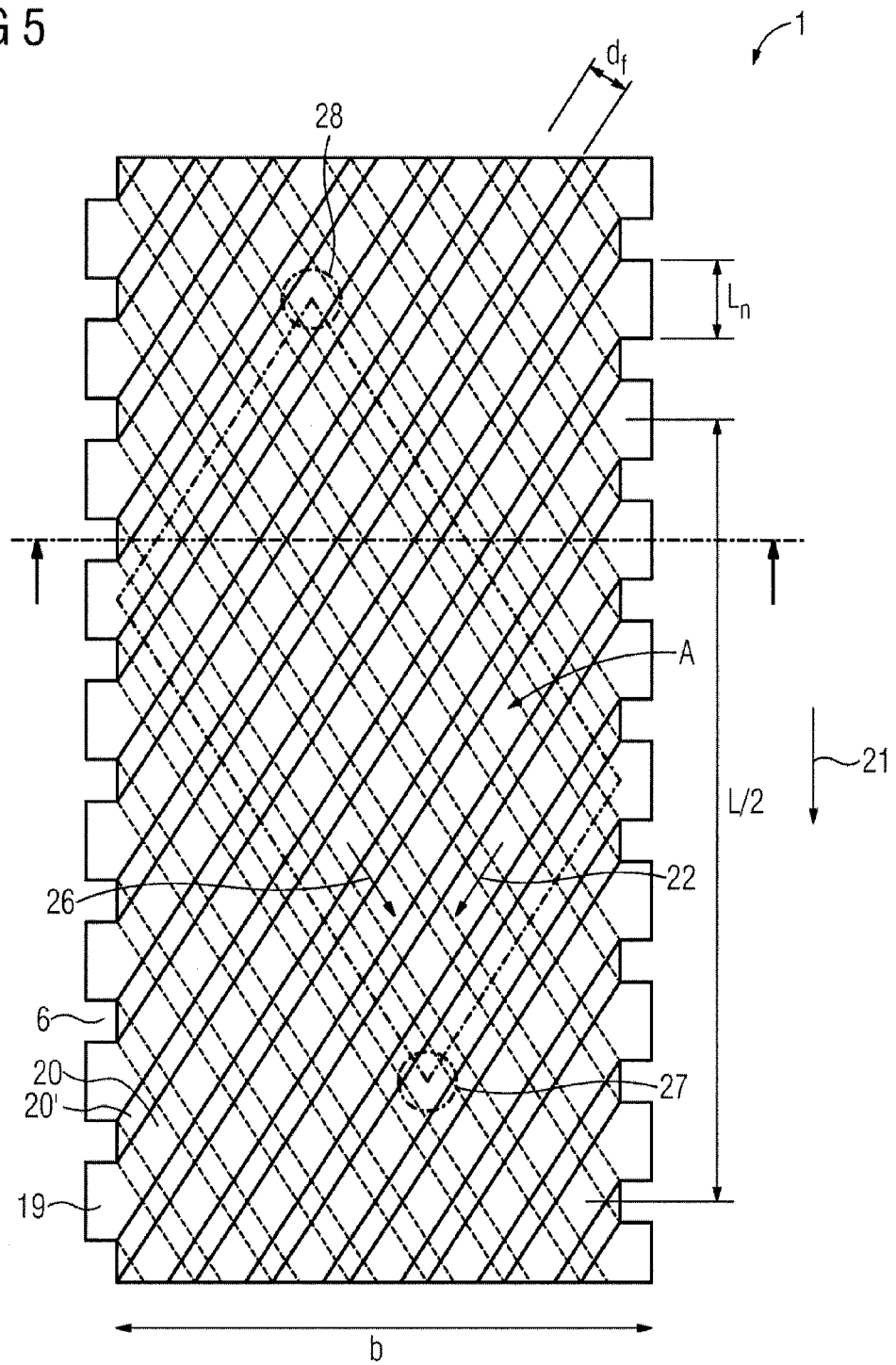
FIG. 5 is a plan view of the multifilament conductor shown in FIG. 3, with filaments on the front side (delimited by continuous lines) and rear side (dashed lines)

FIG. 5 shows a plan view of a multifilament conductor 1 corresponding to the embodiment represented in FIG. 3. It can be seen that the second direction 22 of the filaments 20 on the first carrier 16 (solid lines as delimitation in the width of the filaments 20 in FIG. 5) is arranged at an angle to a third direction 26 of the longitudinal extent of the filaments 20' on the second carrier 17 (dashed lines as delimitation in the width of the filaments 20' in FIG. 5). The filaments 20 and 20' on the carriers 16 and 17 therefore form an angle. The angle lies in the range of a few degrees. Nevertheless, other angles may also be envisaged, as represented for example in FIG. 5.

Via the electrical connection at the edge 19, the filaments 20, 20' on the first 16 and second carriers 17 form a twisted or transposed multifilament conductor 1. The filaments 20, 20' run around the conductor in the shape of a spiral. For the losses $P_h$ due to an alternating-field amplitude $\Delta B$ perpendicular to the multifilament conductor 1, it is no longer the conductor width b as in the case of a conductor without filaments 20, 20', but rather the width $d_f$ of the individual filaments 20, 20' which is crucial. The level of hysteresis losses is reduced by the factor $d_f/b$. Owing to the transposition of the filaments 20, 20', losses due to shielding currents which are induced between the filaments 20, 20' are also less than or equal to zero, if the buffer layer 4 is insulated sufficiently from the carrier 16, 17. The magnetic flux through the surface between two arbitrary parallel filaments 20 or 20' respectively adds up to zero following one revolution after a transposition length L. The voltages induced between them, and therefore the loss-generating eddy currents, are thus reduced effectively irrespective of the total length of the multifilament conductor 1.

In FIG. 5, as a dot-and-dash line, an area A is indicated by way of example which is enclosed by two arbitrary filaments 20 on the front side 9 or 20' on the rear side 10. With a field component B perpendicular to the area A, a magnetic flux B×A passes through the area A. An induced voltage U=½ A dB/dt is applied via each of the two intersection points 27, 28 of the filaments 20, 20' of the front side 9 and rear side 10 of the substrate 2. It is greatest in the middle of the conductor and zero at the edge 19. An electrically insulating layer 29 between the first and second carriers 16 and 17 prevents induced currents perpendicularly through the thin substrate 2 between filaments 20 and 20'. These currents would be superimposed on the transport current in the filaments 20, 20' and drive the filaments 20, 20' into the resistive, lossy range, and additionally generate ohmic losses in the substrate 2. With the electrically insulating layer 29, or interlayer, between the first carrier 16 and the second carrier 17, magnetic coupling via the substrate 2 is prevented.

In magnetic applications in which a high field accuracy is required, as is the case for example in nuclear spin tomography, accelerators and nuclear magnetic resonance spectrometers, the field defects thereby produced in the working volume are reduced significantly owing to the smaller shielding currents which are localized to the filament width. The multifilament conductor 1 can therefore also be used in critical direct-current applications.

In the case of normally conducting electrical contacts between the filaments 20 and 20' via the edges 19, there is an ohmic resistance $R_n$ which is approximately equal to $$R_n = \rho_n \pi (d_n + d_s)/(d_n L_n),$$

where $\rho_n$ is the electrical resistivity, $d_n$, $d_s$ are the thicknesses of the normal metal layer and of the carrier 16, 17, $L_n = d_f L/2$ b is the length of a bridge 23 in the first direction 21 and $d_f$ is the filament width. Two bridges 23 per strand length L add up in each filament 20, 20' to an average resistance per unit length of $$<Rn>/l=\rho n(d_n+d_s)2b/(d_n d_f L2).$$

With a large transposition length L, this resistance can become very small. For example, for a multifilament conductor 1 with b=10 mm width, 0.3 mm total thickness, $I_C$=300 A, 15 filaments 20, 20' of width $d_f$=0.5 mm, an effective critical current density in the multifilament conductor 1 of $j_e$=100 A/mm², a transposition or strand length of L=20 cm, $\rho_n$=2×10⁻⁹ Ωm in copper at 77 K, and a thickness of the copper layer 5 and the substrate 2 of $d_n$=$d_s$=0.1 mm, the averaged ohmic resistance of a filament 20, 20' through a copper bridge 23 is given by $$<Rn>/l=12.5 \,\mu Ohm/m.$$

With I=$I_C$/15=20 A in the filament 20, 20', the voltage drop is 250 μV/m or 2.5 μV/cm. This is in the region of the 1 μV/cm voltage drop with which the critical current is conventionally defined in industrial superconductors.

Additional losses increase with the square of the current. At $I_C$=300 A, these are 75 mW per meter of multifilament conductor 1 or 250 mW per kiloampere-meter. Compared with conventional solutions, the multifilament conductor 1 having HTS material therefore gives an energy saving of 90% compared with ohmic conductors consisting of copper. Magnetization losses $P_h$ in the superconducting material can be reduced by small filament widths $d_f$, as already described. AC applications at 50/60 hertz can therefore be carried out economically viably with the multifilament conductors 1 in superconducting cables, superconducting transformers, electrical machines with superconductors and other applications.

Added to this, the one to two orders of magnitude higher current densities which are possible are also an advantage over conventional copper conductors.

Figure 6A:
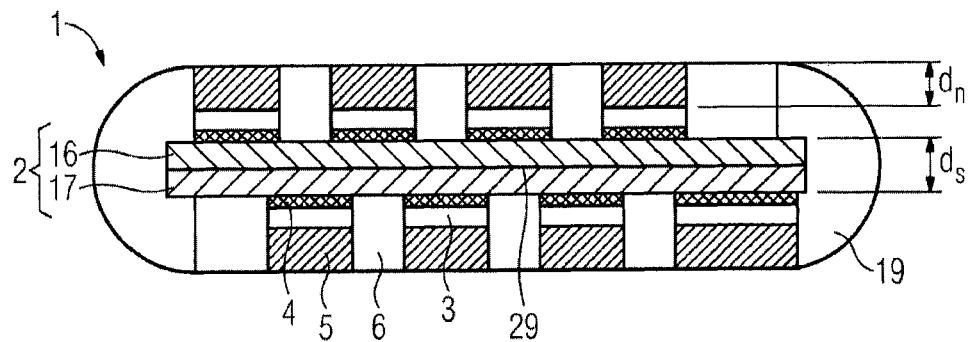
FIG. 6a is a sectional view of the multifilament conductor shown in FIG. 3, with two carriers placed in direct connection.
Figure 6B:
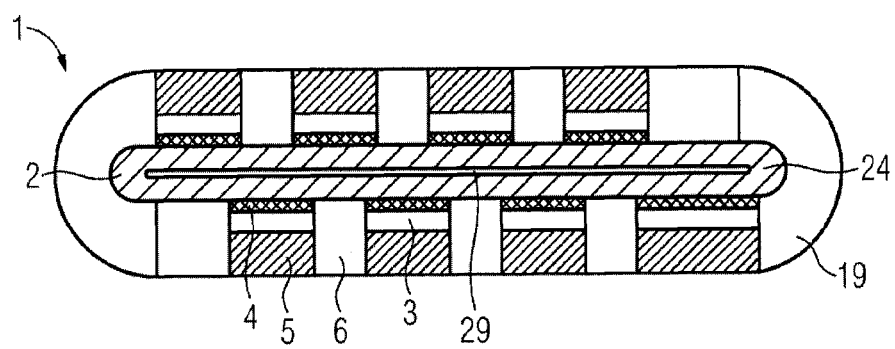
FIG. 6b is a sectional view of the multifilament conductor shown in FIG. 3, with a compressed tube as the substrate.
Figure 6C:
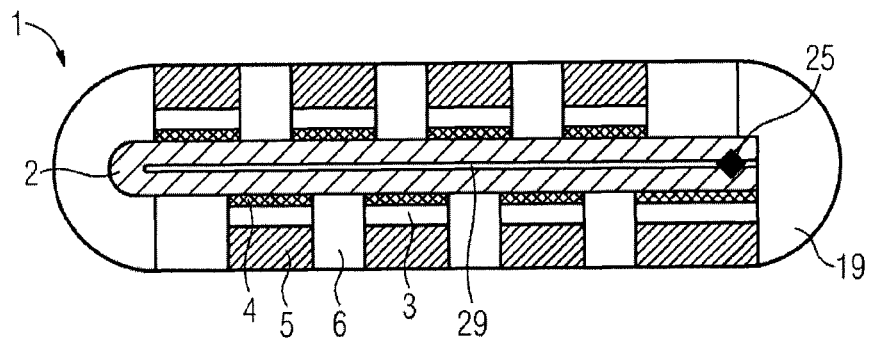
FIG. 6c is a sectional view of the multifilament conductor shown in FIG. 3, with a folded-together part as the substrate with a weld bead on the open side.

FIGS. 6a to 6c show sectional representations of the multifilament conductor 1 represented in FIG. 5 with different embodiments of the connection 18 of the first and second carriers 16 and 17 via at least one interlayer 29. The filaments 20, 20' are constructed similarly to the above-described filaments 20, 20' from a layer stack: buffer layer 4, superconducting layer 3 and stabilization layer 5. Trenches 6 are respectively formed between neighboring filaments 20, 20'. Filaments 20, 20' on the front side 9 and rear side 10 of the substrate 2 are electrically connected to one another by the stabilization layer 5 via the edge 19.

In FIG. 6a, the first carrier 16 and the second carrier 17 are respectively connected to one another in an electrically insulating fashion over the surface via their rear sides. The connection may, for example, be carried out by adhesively bonding the rear sides onto one another. A thermally insulating layer may additionally be arranged between the carriers 16 and 17.

In FIG. 6b, the carriers 16 and 17 are formed by compressing a tube 24 of substrate material 2. A thin insulating air gap, which can also be used for cooling, may remain inside the tube. For example, liquid nitrogen may be passed through this gap and additionally cool the multifilament conductor 1 from the inside.

In FIG. 6c, the first and second carriers 16 and 17 are formed by folding together a wide carrier, with a width of the wide carrier equal to 2 times the width of a carrier 16, 17, the fold line extending in the middle of the wide carrier along its longitudinal axis. The fold line forms an edge 19 of the substrate 2, and a weld or adhesive bead 25 may connect the first and second carriers 16 and 17 to one another in a mechanically stable fashion along the opposite edge 19 of the substrate 2. When the stabilization layer 5 is deposited and the trenches 6 are formed, the filaments 20 of the first and second carriers 16 and 17 are respectively connected via the edges 19, in which case, when the trenches 6 are also formed at the edge 19, neighboring filaments 20 of a carrier 16 or 17 are respectively electrically separated from one another at the edge 19. A combination of the exemplary embodiments in FIGS. 6a to 6c with the exemplary embodiment of FIG. 4 provides electrical connection of filaments 20 on a carrier 16 or 17 via the bridges 23.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

The invention claimed is:

1. A multifilament conductor comprising:
   a ribbon-shaped substrate, having a first direction parallel to a longitudinal extent thereof; and
   at least one superconducting layer formed on at least one surface of the ribbon-shaped substrate and subdivided into filaments, at least one filament having a second direction, parallel to a longitudinal extent thereof, forming an angle greater than zero with the first direction of the ribbon-shaped substrate,
   wherein the angle between the first direction of the ribbon-shaped substrate and the second direction of the at least one filament is between 1 and 5 degrees.

2. The multifilament conductor as claimed in claim 1, wherein the at least one filament is formed fully along the second direction without a length component parallel to the first direction.

3. The multifilament conductor as claimed in claim 2,
   wherein the ribbon-shaped substrate has a first surface on a front side and a second surface, opposite the first surface, on a rear side, and
   wherein the filaments include a first group, formed on the first surface in the second direction, and a second group, formed on the second surface, having a third direction parallel to a longitudinal direction of the filaments in the second group and different from the second direction of the filaments in the first group.

4. The multifilament conductor as claimed in claim 3,
   wherein the ribbon-shaped substrate includes at least one layer formed on at least one side surface on at least one side face of the ribbon-shaped substrate, and
   wherein at least one filament in the first group is electrically conductively connected to at least one filament of the second group by the at least one layer of the ribbon-shaped substrate.

5. The multifilament conductor as claimed in claim 4, further comprising at least one electrical bridge, formed between at least two neighboring filaments on at least one of the first and second surfaces, each electrical bridge providing an electrical connection of the at least two neighboring filaments.

6. The multifilament conductor as claimed in claim 5, wherein the at least one electrical bridge is arranged centrally on the at least one of the first and second surfaces, with a longitudinal direction of the bridge parallel to the first direction of the ribbon-shaped substrate.

7. The multifilament conductor as claimed in claim 6, wherein the multifilament conductor comprises a layer stack formed of ribbon-shaped carrier material, at least one buffer layer, at least one high-temperature superconducting layer, and/or at least one stabilization layer.

8. The multifilament conductor as claimed in claim 7,
wherein the ribbon-shaped carrier material is a steel, and/or
wherein the at least one buffer layer includes at least one material from the group: Al, yttria, IBAD MgO, homo-epi MgO, LMO, and/or
wherein the at least one superconducting layer is formed of YBCO, and/or
wherein the at least one bridge and the at least one high-temperature superconducting layer are formed of YBCO, and/or
wherein the at least one stabilization layer and the at least one bridge are formed of copper or silver or a layer stack with at least one copper and/or at least one silver layer.

9. The multifilament conductor as claimed in claim 8,
wherein the ribbon-shaped carrier material has a thickness between 50 µm and 100 µm, and a width of substantially 10 mm, and/or
wherein the at least one buffer layer has a thickness of substantially 100 nm, and/or
wherein the at least one superconducting layer has a thickness of substantially 1 pm, and/or
wherein the at least one filament has a width of substantially 0.5 mm, and/or
wherein the at least one stabilization layer has a thickness of substantially 3 µm.

10. The multifilament conductor as claimed in claim 9, wherein the filaments are transposed and have a transposition length of substantially 20 cm.

11. A method for producing a multifilament conductor, comprising:
forming first and second ribbon-shaped carrier materials, both having a first direction parallel to a longitudinal extent thereof, each having first and second sides on opposite faces, the first side of each of the first and second ribbon-shaped carrier materials having at least one superconducting layer applied thereto and a stabilization layer applied onto the at least one superconducting layer, the superconducting layers and the stabilization layers of each of the first and second ribbon-shaped carrier materials being subdivided into filaments with at least one filament of at least one superconducting layer having a second direction, parallel to a longitudinal extent thereof, forming an angle greater than zero with the first direction of the first and second ribbon-shaped carrier materials, and the stabilization layer of the first ribbon-shaped carrier material overlapping with the stabilization layer of the second ribbon-shaped carrier material at edges of the first and second ribbon-shaped carrier materials so that an electrical connection of the stabilization layers is established via the edges; and
congruently bringing the second sides of the first and second ribbon-shaped carrier materials into mechanical connection with each other,
wherein the angle between the first direction of the ribbon-shaped substrate and the second direction of the at least one filament is between 1 and 5 degrees.

12. The method as claimed in claim 11, further comprising
applying the superconducting and stabilization layers by at least one of electrolysis, soldering, evaporation coating, sputtering and thermal decomposition of metal compounds in vapor phase, and/or
subdividing the superconducting and stabilization layers into the filaments by at least one of lasering and chemical etching of trenches respectively passing fully through the superconducting and stabilization layers.

13. The method as claimed in claim 12,
wherein the trenches are formed with a non-zero angle between the first direction of the ribbon-shaped substrate and the second direction of the at least one filament, and
further comprising electrically connecting the filaments on the first and second ribbon-shaped carrier materials via edges thereof to form spiral-shaped current paths.

14. The method as claimed in claim 11, further comprising applying the superconducting and stabilization layers by at least one of printing, adhesive bonding, electrolysis, soldering, evaporation coating, sputtering and thermal decomposition of metal compounds in vapor phase to directly form a filament structure.

15. The method as claimed in one of claim 14, wherein said bringing of the first and second ribbon-shaped carrier materials into mechanical connection includes separating the first and second ribbon-shaped carrier materials by at least one of a heat-resistant insulating interlayer and an air gap by one of
welding the first and second ribbon-shaped carrier materials,
folding a single ribbon-shaped carrier ribbon into the first and second ribbon-shaped carrier materials lying above one another, and
rolling a tube flat, prior to texturizing rolling of the first and second ribbon-shaped carrier materials.

* * * * *

UNITED STATES PATENT AND TRADEMARK OFFICE
CERTIFICATE OF CORRECTION

PATENT NO. : 9,024,192 B2
APPLICATION NO. : 13/392380
DATED : May 5, 2015
INVENTOR(S) : Heinz-Werner Neumüller et al.

It is certified that error appears in the above-identified patent and that said Letters Patent is hereby corrected as shown below:

In the Claims

Column 11, Line 24, In Claim 9, delete "1 pm," and insert -- 1 μm, --.
Column 12, Line 36, In Claim 15, after "in" delete "one of".

Signed and Sealed this
Eighteenth Day of August, 2015

Michelle K. Lee
*Director of the United States Patent and Trademark Office*